US009786582B2

(12) United States Patent
Chang et al.

(10) Patent No.: US 9,786,582 B2
(45) Date of Patent: Oct. 10, 2017

(54) PLANAR LEADFRAME SUBSTRATE HAVING A DOWNSET BELOW WITHIN A DIE AREA

(71) Applicant: TEXAS INSTRUMENTS INCORPORATED, Dallas, TX (US)

(72) Inventors: Chia-Yu Chang, Taipei Hsein (TW); Bob Lee, Taipei Hsien (TW); Steven Su, Tainan (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/010,938

(22) Filed: Jan. 29, 2016

(65) Prior Publication Data

US 2017/0221799 A1  Aug. 3, 2017

(51) Int. Cl.
*H01L 23/495* (2006.01)
*H01L 21/56* (2006.01)
*H01L 23/31* (2006.01)
*H05K 1/11* (2006.01)

(52) U.S. Cl.
CPC ...... *H01L 23/49503* (2013.01); *H01L 21/561* (2013.01); *H01L 23/3107* (2013.01); *H05K 1/111* (2013.01)

(58) Field of Classification Search
CPC ....... H01L 23/495; H01L 24/32; H01L 24/33; H01L 23/49503; H01L 21/561; H01L 23/3107; H05K 1/111
USPC .............. 257/676, 773, 774, 666, 696, 698, 257/690–694
See application file for complete search history.

(56) References Cited

U.S. PATENT DOCUMENTS

| 5,197,183 A * | 3/1993 | Chia ................. B29C 45/14655 257/E21.504 |
| 5,907,769 A * | 5/1999 | Corisis ................ H01L 23/4951 257/E23.039 |
| 9,013,013 B1 * | 4/2015 | Beer .................... G01L 19/0069 257/415 |
| 9,324,640 B1 * | 4/2016 | Eugene Lee ...... H01L 23/49551 |
| 2002/0195717 A1 * | 12/2002 | Huang .................. B82Y 15/00 257/777 |
| 2003/0206401 A1 * | 11/2003 | Zhou ................... H01L 23/3128 361/719 |
| 2007/0108561 A1 * | 5/2007 | Webster ............ H01L 27/14618 257/666 |
| 2007/0108566 A1 * | 5/2007 | Trasporto ............ H01L 23/3107 257/676 |
| 2009/0014851 A1 * | 1/2009 | Choi ................. H01L 23/49503 257/676 |
| 2009/0166822 A1 * | 7/2009 | Camacho .......... H01L 23/49541 257/670 |
| 2009/0166826 A1 * | 7/2009 | Janducayan ...... H01L 23/49503 257/676 |

(Continued)

*Primary Examiner* — Alexander Oscar Williams
(74) *Attorney, Agent, or Firm* — Lawrence J. Bassuk; Charles A. Brill; Frank D. Cimino (57) ABSTRACT

A leadframe for encasing in a mold material includes a plurality of interconnected support members. A die pad is connected to the support members and includes a bottom surface. The die pad is configured to receive a die. A downset is connected to the die pad and positioned below the bottom surface. The downset includes at least one wall defining an interior volume for receiving a flow of the mold material to reduce the velocity of the mold material flow through the downset.

11 Claims, 10 Drawing Sheets

(56) References Cited

U.S. PATENT DOCUMENTS

2014/0077352 A1* 3/2014 Leal ................... H01L 24/32
257/704
2016/0322237 A1* 11/2016 Owen ............... H01L 23/49582

* cited by examiner

PLANAR LEADFRAME SUBSTRATE HAVING A DOWNSET BELOW WITHIN A DIE AREA

TECHNICAL FIELD

The invention relates generally to leadframes and, in particular, relates to a downset for a leadframe.

BACKGROUND

Circuit boards include a leadframe and a series of electrical components electrically connected by wires. Once the components are assembled and connected, an electrically insulating material is overmolded over the circuit board to form the finished product and protect the components therein.

SUMMARY

In one example, a leadframe or leadframe substrate for encasing in a mold material includes a plurality of interconnected support members. A die pad is connected to the support members and includes a bottom surface. The die pad is configured to receive a die. A downset is connected to the die pad and positioned below the bottom surface. The downset includes at least one wall defining an interior volume for receiving a flow of the mold material to reduce the velocity of the mold material flow through the downset.

In another example, a circuit board for encasing in a mold material includes a leadframe or leadframe substrate having a plurality of interconnected support members. A die pad connected to the support members includes a bottom surface. A downset is connected to the die pad and positioned below the bottom surface. The downset includes at least one wall defining an interior volume. A die is secured to the die pad. At least one wire is electrically connects die to the support members. The interior volume of the downset receives a flow of the mold material to reduce the velocity of the mold material flow around the circuit board.

In another example, a method of forming a circuit board includes molding a leadframe or leadframe substrate having a plurality of interconnected support members, a die pad connected to the support members and having a bottom surface, and a downset connected to the die pad and positioned below the bottom surface, the downset having at least one wall defining an interior volume. A die is secured to the die pad. The die is electrically connected to the support members with at least one wire. The circuit board is overmolded with an electrically insulating material mold material that flows over the leadframe. The interior volume of the downset receives a flow of the mold material to reduce the velocity of the mold material flow through the downset.

In another example, a package semiconductor device includes a leadframe or leadframe substrate having a plurality of interconnected support members. A die pad is connected to the support members and has a bottom surface. A downset connected to the die pad is positioned below the bottom surface. The downset has at least one wall defining an interior volume. A die is secured to the die pad. At least one wire electrically connects the die to the support members. Mold material is overmolded around the leadframe, the die, and the at least one wire to electrically insulate the same. The interior volume of the downset receives a flow of the mold material to reduce the velocity of the mold material flow through the downset during overmolding.

Other objects and advantages and a fuller understanding of the invention will be had from the following detailed description and the accompanying drawings.

DETAILED DESCRIPTION

Figure 1:
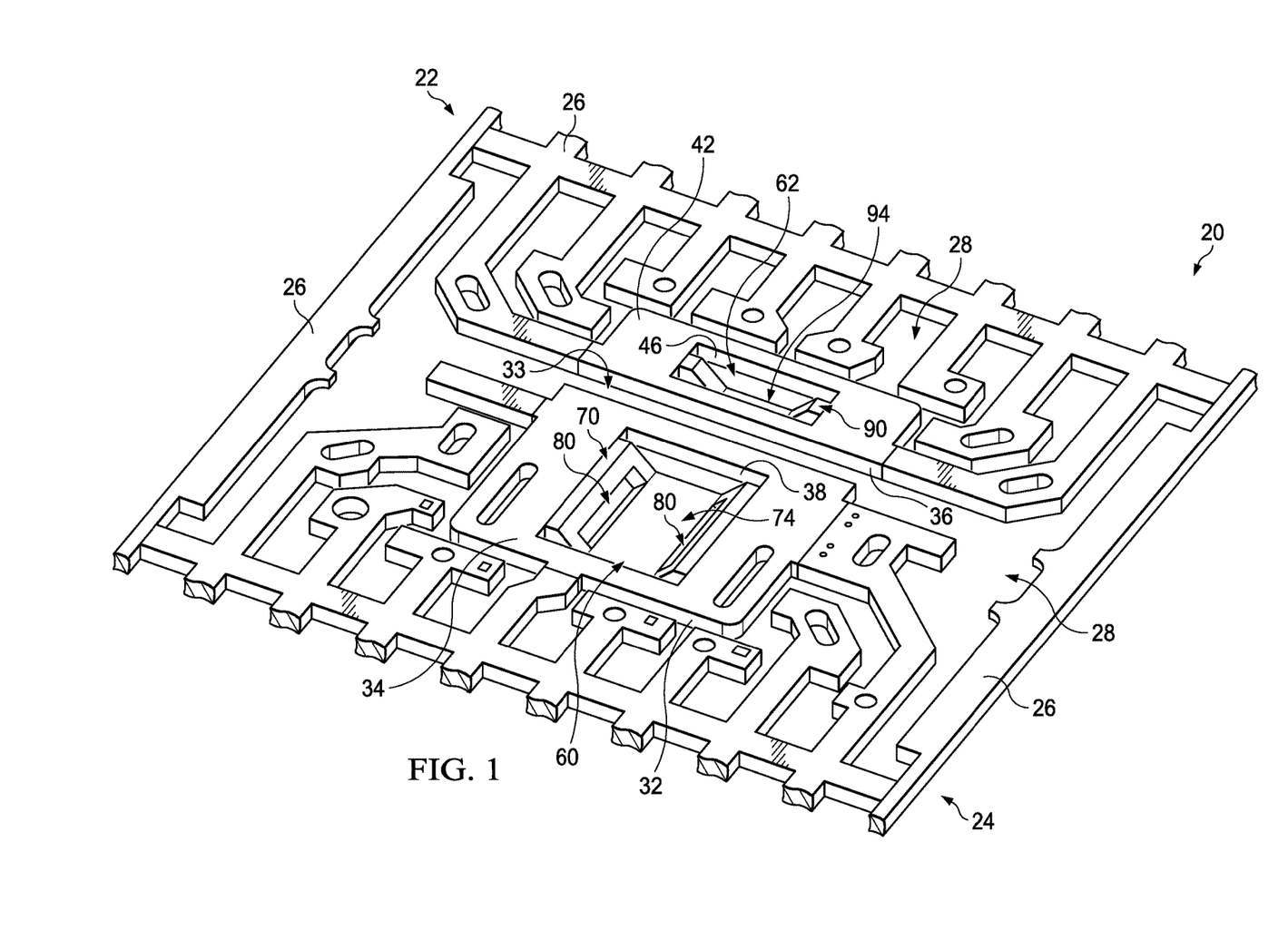
FIG. 1 illustrates a top isometric view of an example leadframe for a circuit board.

The present relates generally to leadframes and, in particular, relates to a downset for a leadframe or leadframe substrate. FIGS. 1-4 illustrates one example leadframe for a circuit board, e.g., a small outline integrated circuit (SOIC). Referring to FIG. 1, the leadframe or leadframe substrate 20 extends generally in a plane from a first end 22 to a second end 24 and includes a series of interconnected support members 26. The support members 26 form a network having a plurality of spaces or gaps 28. The leadframe 20 is formed from a plate of electrically conductive material, e.g., copper or copper-alloy, that is stamped and/or etched to define the support members 26 and spaces 28 in a desired configuration.

Figure 2:
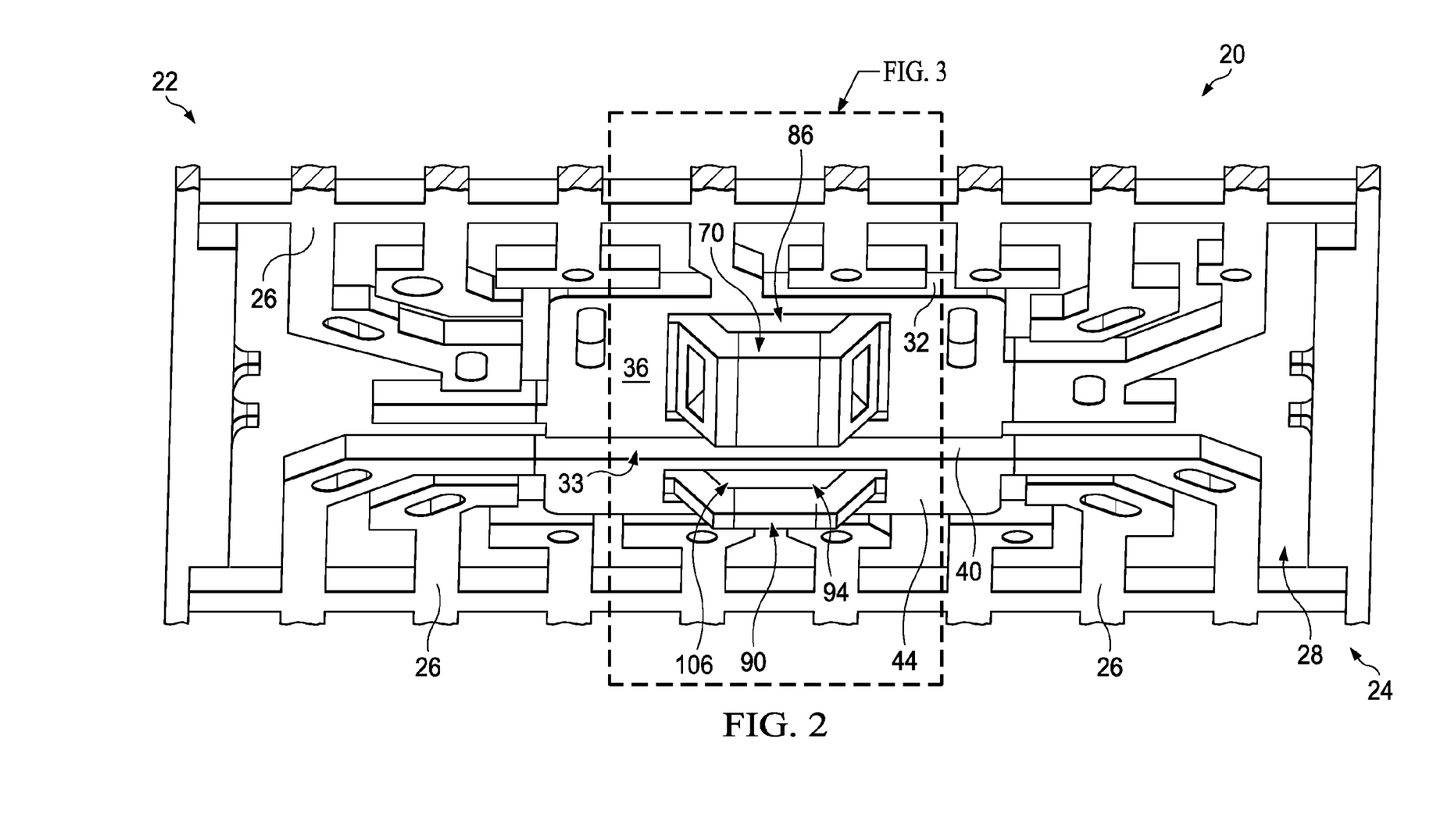
FIG. 2 illustrates a bottom view of the leadframe of FIG. 1.

Also referring to FIG. 2, a pair of die pads 32, 40 formed integrally with the support members 26 is provided between the first and second ends 22, 24. The die pads 32, 40 are illustrated as rectangular but could have any shape. The die pads 32, 40 extend parallel to one another and are spaced apart by a passage or gap 33. Although two die pads 32, 40 are shown the leadframe 20 could include more or fewer die pads.

Figure 3:
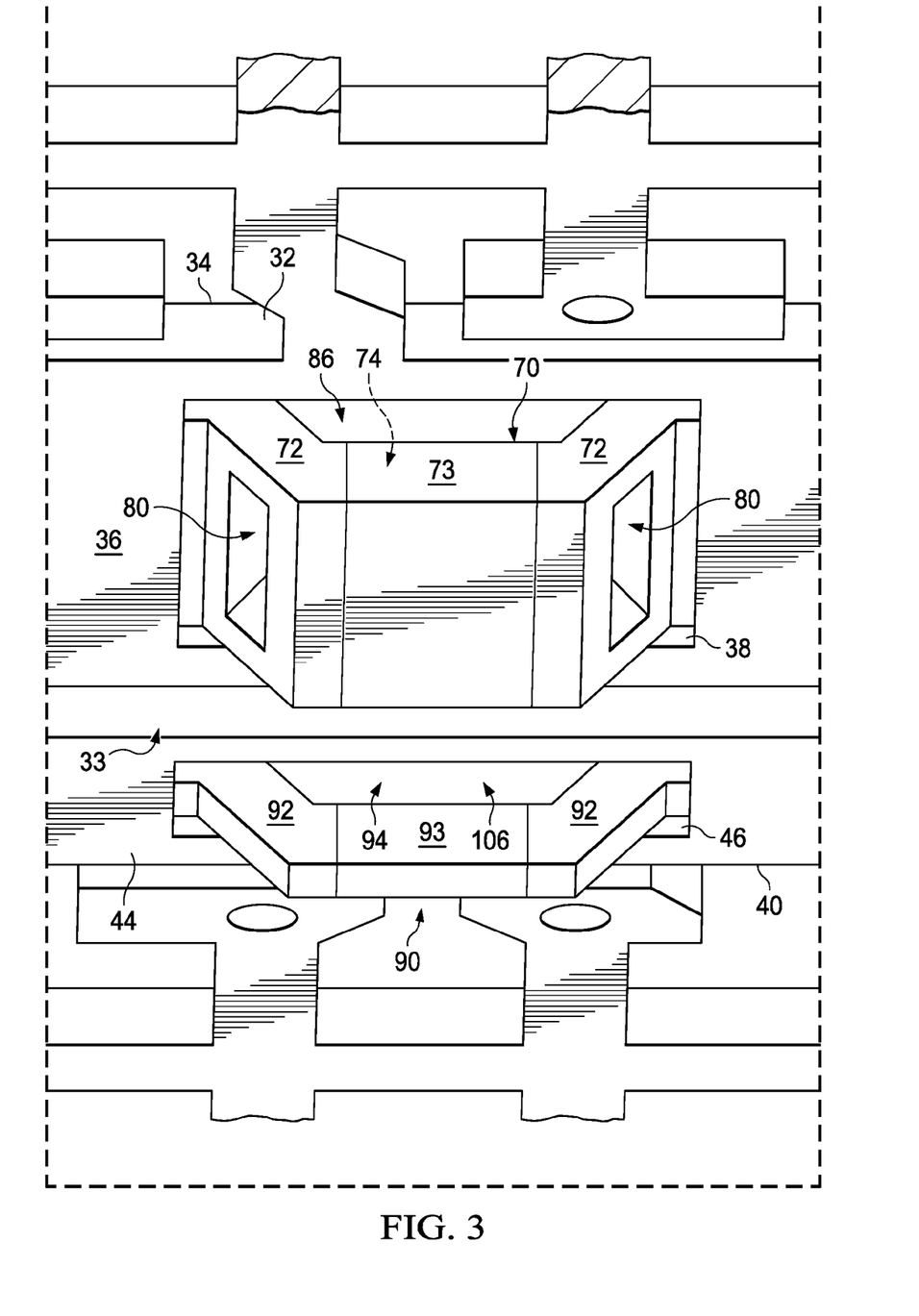
FIG. 3 illustrates an enlarged view of a portion of FIG. 2.

As shown in FIGS. 1-3, the first die pad 32 includes a top surface 34 and a bottom surface 36. The second die pad 40 includes a top surface 42 and a bottom surface 44. The die pads 32, 40 reside in the same plane as the support members 26, i.e., the top surfaces 34, 42 are coplanar and in the same plane as the top surfaces of the support members.

An opening 60 extends entirely through the first die pad 32 from the top surface 34 to the bottom surface 36. The opening 60 is defined by an inner surface 38 of the first die pad 32. An opening 62 extends entirely through the second die pad 40 from the top surface 42 to the bottom surface 44. The opening 62 is defined by an inner surface 46 of the second die pad 40. The openings 60, 62 are rectangular but could have any other shape.

Figure 4:
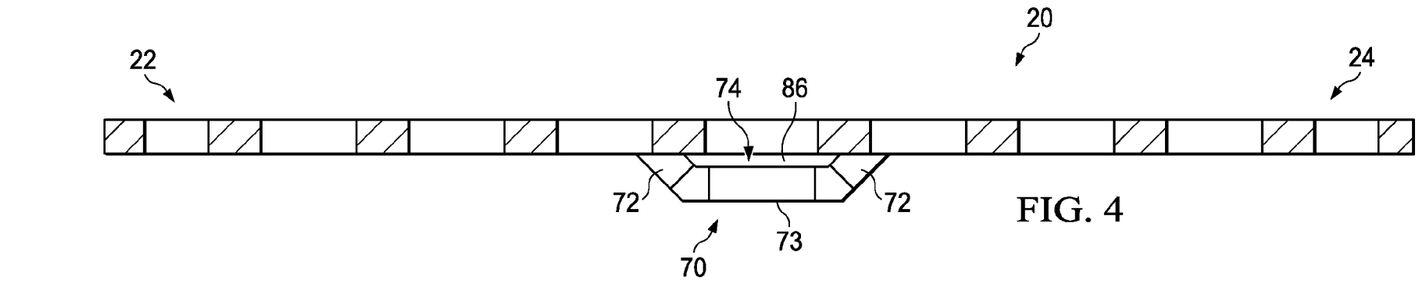
FIG. 4 illustrates a front view of the leadframe of FIG. 1.

Referring to FIGS. 2-4, the leadframe 20 includes at least one downset for controlling the flow of mold material through and around the leadframe, as will be described. At least one downset 70 extends from the inner surface 38 of the first die pad 32 and away from the top surface 34 to a position below the bottom surface 36 (as shown in FIGS. 1-3). As shown, a single downset 70 is associated with the first die pad 32. The downset 70 could alternatively extend from the support members 26 or from the bottom surface 36 (not shown) to the same position below the bottom surface. In any case, each downset 70 is aligned with the opening 60 in the first die pad 32.

The downset 70 is formed from at least one wall (FIG. 3). As shown, the downset 70 includes a pair of sidewalls 72 connected by a bottom or end wall 73. The sidewalls 72 extend downwardly from the inner surface 38 towards one another. The bottom wall 73 extends substantially parallel to the first die pad 32. As shown, the walls 72, 73 cooperate to form a substantially triangular downset 70. Alternatively, the at least one wall could define a rounded or polygonal downset 70 (not shown).

The walls 72, 73 and bottom surface 36 of the first die pad 32 cooperate to define an interior volume 74 of empty space. A pair of lateral openings 86 between the legs 72 at opposite ends of the interior space 74 fluid connect the interior volume to ambient outside the downset 70 and below the bottom surface 36. One or both lateral openings 86 can be closed by an additional wall (not shown). In any case, the opening 60 in the first die pad 32 is in fluid communication with the interior volume 74.

An opening 80 extends entirely through each sidewall 72 to the interior volume 74. Each opening 80 can be rectangular (as shown) or have a circular or any polygonal shape. Alternatively or additionally, the bottom wall 73 can include an opening (not shown) having any shape. Moreover, all the walls 72, 73 can be free of openings. Regardless, both the openings 80 and the lateral openings 86 are in fluid communication with the opening 60 in the first die pad 32 via the interior volume 74.

At least one downset 90 extends from the inner surface 46 of the second die pad 40 and away from the top surface 42 to a position below the bottom surface 44 (as shown in FIGS. 1-3). As shown, a single downset 90 is associated with the second die pad 40. The downset 90 could alternatively extend from the support members 26 or from the bottom surface 46 (not shown) to the same position below the bottom surface. In any case, each downset 90 is aligned with the opening 62 in the second die pad 40.

The downset 90 is formed from at least one wall (FIG. 3). As shown, the downset 90 includes a pair of sidewalls 92 connected by a bottom or end wall 93. The sidewalls 92 extend downwardly from the inner surface 46 towards one another. The bottom wall 93 extends substantially parallel to the second die pad 40. As shown, the walls 92, 93 cooperate to form a substantially triangular downset 90. Alternatively, the at least one wall could define a rounded or polygonal downset 90 (not shown).

The walls 92, 93 and bottom surface 44 of the second die pad 40 cooperate to define an interior volume 94 of empty space. A pair of lateral openings 106 between the legs 92 at opposite ends of the interior space 94 fluid connect the interior volume to ambient outside the downset 90 and below the bottom surface 44. One or both lateral openings 106 can be closed by an additional wall (not shown). In any case, the opening 62 in the second die pad 40 is in fluid communication with the interior volume 94.

Figure 5:
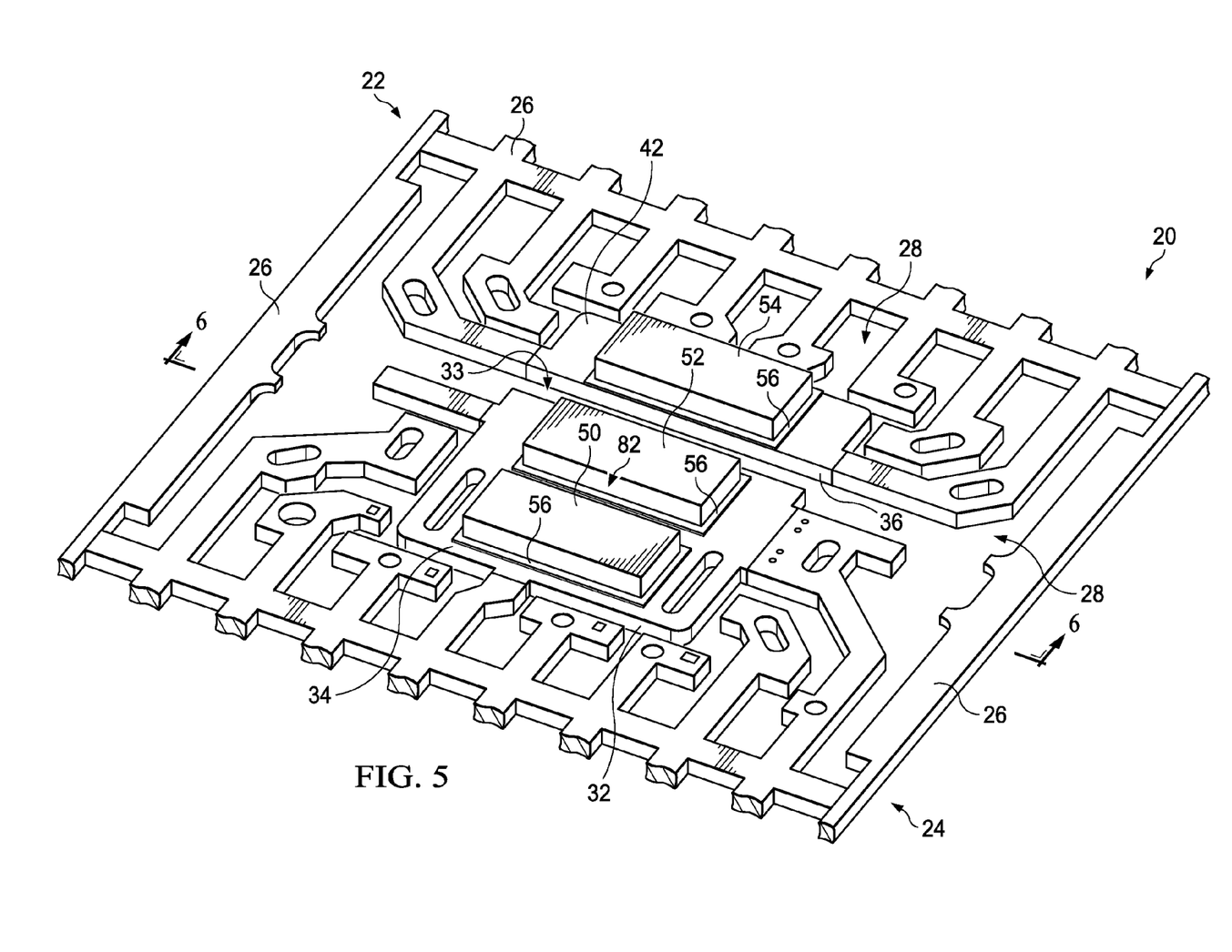
FIG. 5 illustrates the leadframe of FIG. 1 following a second stage of manufacturing.
Figure 6:
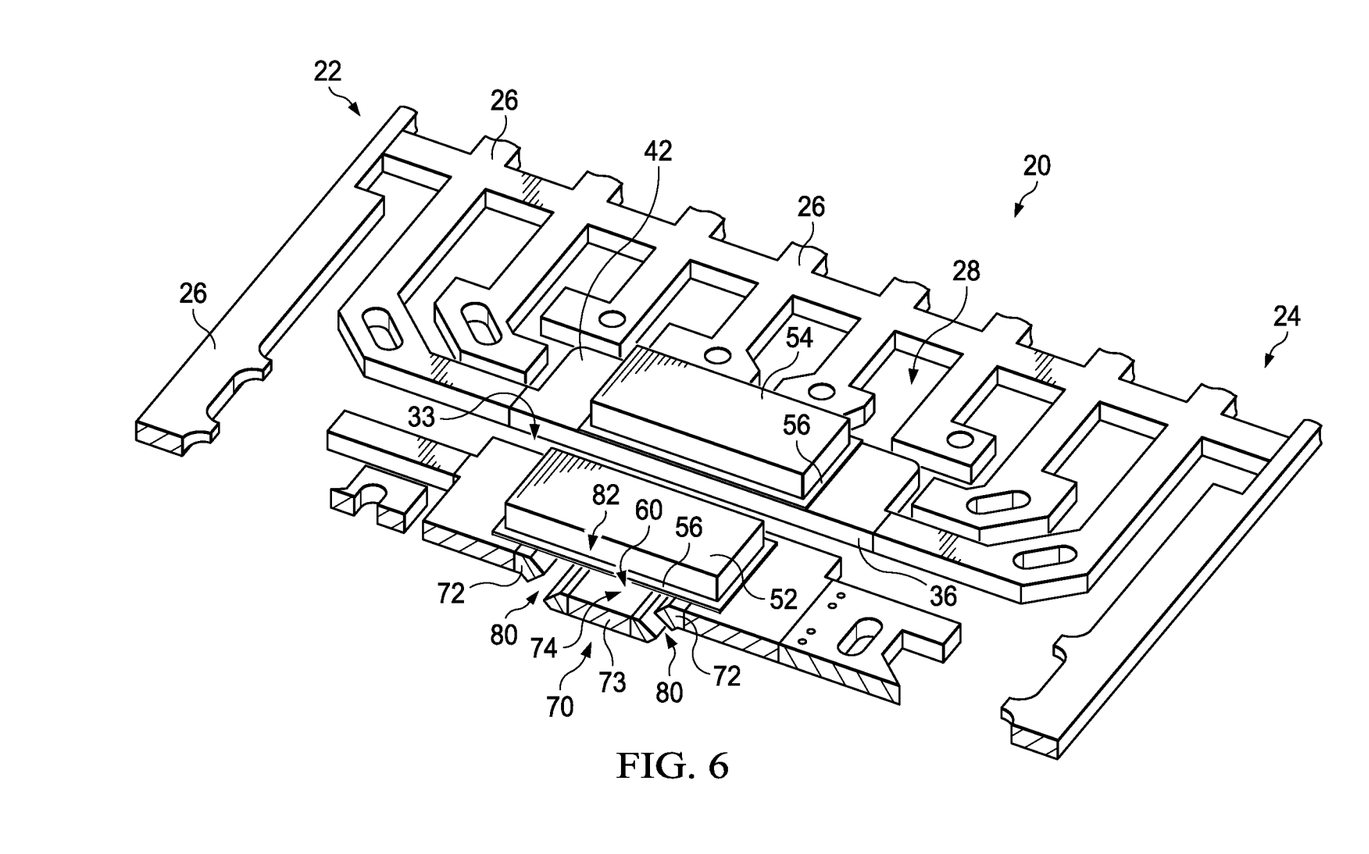
FIG. 6 illustrates a section view of the leadframe of FIG. 5 taken along line 6-6.

During manufacturing, the leadframe or leadframe substrate 20, including the support members 26, die pads 32, 40, and downsets 70, 90, is first formed (FIGS. 1-4). In FIG. 5, an adhesive constituting a film or paste 56 is applied to the top surface 34 of the first die pad 32 and the top surface 42 of the second die pad 40. The adhesive 56 extends around the perimeter of the opening 60 and around the perimeter of the opening 62. First and second dies 50, 52 are secured to the adhesive 56 on the first die pad 32. A third die 54 is secured to the adhesive 56 on the second die pad 40. Each die 50, 52, 54 constitutes a block of semiconductor material, e.g., electronic-grade silicon or gallium-arsenide, in which one or more functional circuits (not shown) is provided. Alternatively or additionally, a heat sink or other package can be mounted to either or both die pads 32, 40 (not shown).

The first and second dies 50, 52 are secured to the first die pad 32 such that a space or gap 82 extends between the first and second dies. Due to this configuration, the first and second dies 50, 52 cover or obstruct a portion of the opening 60. Alternatively, the entire opening 60 is obstructed by the first and second dies 50, 52 (not shown). The third die 54 is secured to the second die pad 40 such that the entire opening 62 is obstructed. Alternatively, only a portion of the opening 62 is obstructed by the third die 54 (not shown).

Figure 7:
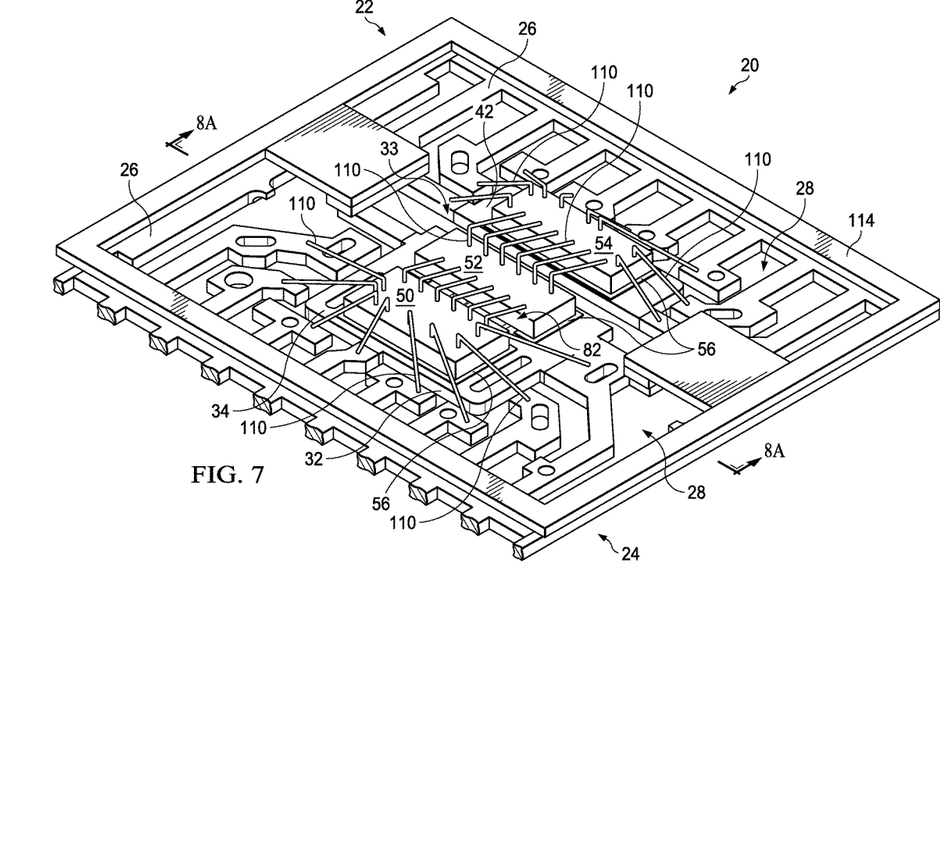
FIG. 7 illustrates the leadframe of FIG. 1 following a third stage of manufacturing.

Referring to FIG. 7, one or more electrically conductive wire or wire loops 110 are secured to the dies 50, 52, 54 and the support members 26 to electrically connect the dies to the support members. In one example, the wires 110 are gold wires and the ends of the wires are secured to the respective dies 50, 52, 54 and the support members 26 by thermosonic bonding. A clamp 114 can be used to secure the leadframe 20 in place while the wires 110 are bonded to the dies 50, 52, 54 and support members 26.

Figure 8A:
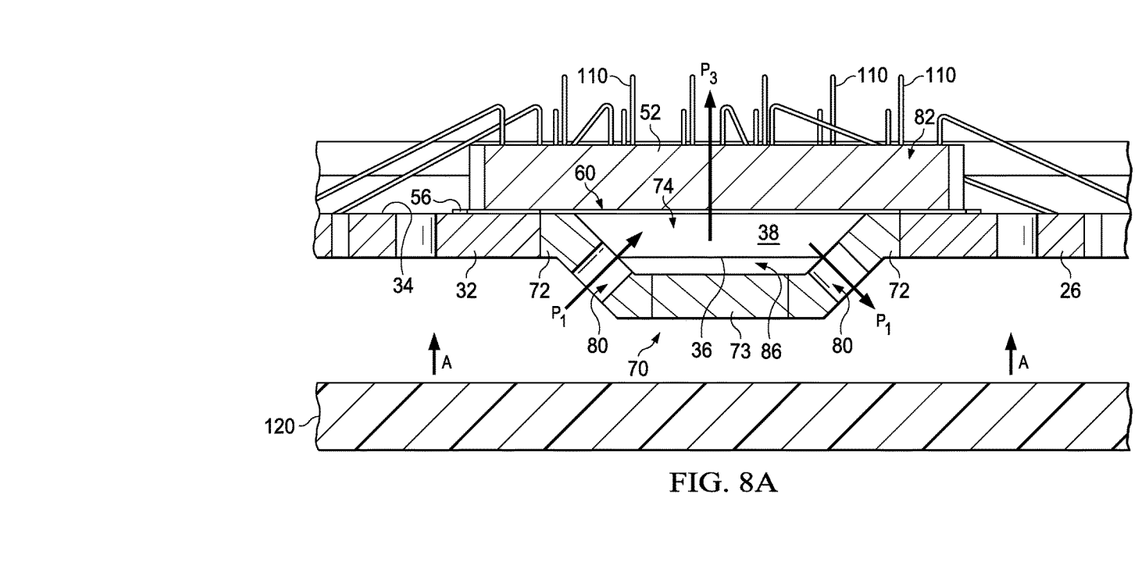
FIG. 8A illustrates a section view of the leadframe of FIG. 7 taken along line 8A-8A and during a first stage of overmolding.
Figure 8B:
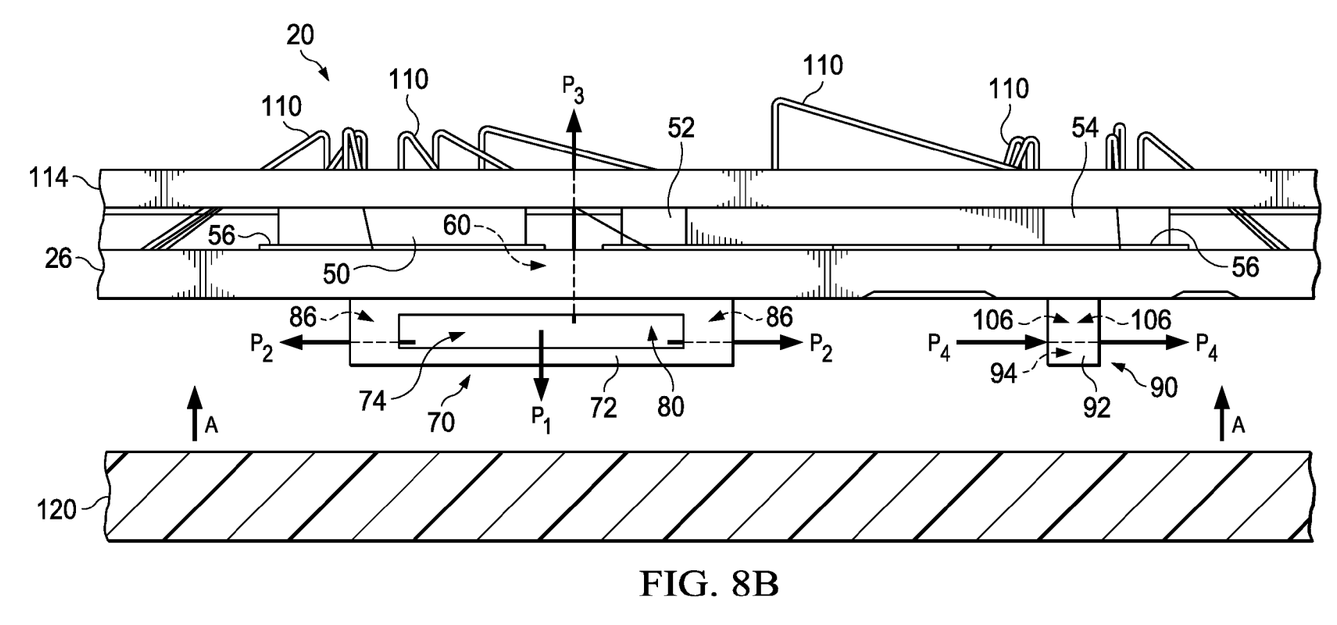
FIG. 8B illustrates a right side view of the leadframe of FIG. 7 during a second stage of overmolding.

As shown in FIGS. 8A-8B, after the wires 110 are secured to the dies 50, 52, 54 and support members 26 the entire leadframe is overmolded with an electrically insulating mold material 120, such as plastic. The mold material 120 flows downward under the influence of gravity through and around the leadframe 20, into the spaces 28 between support members 26, and around the support members, dies 50, 52, 54 and wires 110.

Referring to FIGS. 8A and 8B, the mold material 120 collects beneath the leadframe 20 and the height of the mold material from the bottom of the mold rises in the direction indicated generally by the arrow A towards the downset 70. From this point, the mold material 120 can flow along several paths through the downset 70. More specifically, the mold material 120 can flow into one or more of the openings 80, 86 and out of one or more of the openings 80, 86.

As shown, the mold material 120 flows rightward along a flow path generally indicated at P1 through the opening 80 in the leftmost wall 72, into the interior volume 74 of the downset 70, and then laterally out of the interior volume through the opening 80 in the rightmost wall 72. The mold material 120 can also exit the interior volume 74 by flowing laterally through one or both lateral openings 86 along the flow path generally indicated at P3 (FIG. 8B).

In another instance, the mold material 120 flows laterally through both openings 80, into the interior volume 74, and then laterally out of the interior volume through one or both lateral openings 86 (not shown). In yet another instance, the mold material 120 flows laterally through one or both lateral openings 86, into the interior volume 74, and then laterally out of the interior volume through one or both openings 80 (not shown). In any case, since the first and second dies 50, 52 are spaced by the gap 82, the mold material 120 also flows upwards along a flow path generally indicated at P3 from the interior volume 74 of the downset 70, through the opening 60 in the first die pad 32, and through the gap 82.

Regardless of how the mold material 120 enters and exits the interior volume 74, the flowing mold material engages the walls 72, 73 of the downset 70 and accumulates/collects within the downset 70, thereby slowing its velocity relative to mold material that flows unimpeded through and around the leadframe 20. In other words, the mold material 120 flow is slowed/impeded by the openings 80, 86, which act as flow constrictions.

Referring to FIG. 8B, while this occurs the mold material 120 also rises in the direction A towards the downset 90. From this point, the mold material 120 can flow along several paths through the downset 90. More specifically, the mold material 120 can flow into and out of one or more of the openings 106.

As shown, the mold material 120 flows rightward along a flow path generally indicated at P4 through the leftmost opening 106 between the walls 92, 93, into the interior volume 94 of the downset 90, and then laterally out of the interior volume through the rightmost opening 106 between the walls 92, 93. In another instance, the mold material 120 flows through the rightmost opening 106 between the walls 92, 93, into the interior volume 94, and then laterally out of the interior volume through the leftmost opening 106 between the walls 92, 93 (not shown). In yet another instance, the mold material 120 flows laterally through both openings 106 and into the interior volume 94 (not shown). In either case, the mold material 120 can flow laterally out of the interior volume 94 through both openings 106 (not shown).

Since the opening 62 in the second die pad 40 is completely obstructed by the third die 54, the mold material 120 cannot flow upwards through the opening 62 towards the third die. Regardless of how the mold material 120 enters and exits the interior volume 94, the flowing mold material engages the walls 92, 93 of the downset 90 and accumulates/collects within the downset 94, thereby slowing its velocity relative to mold material that flows unimpeded through and around the leadframe 20. In other words, the mold material 120 flow is slowed/impeded by the openings 106, which act as flow constrictions.

Since the mold material 120 collects and solidifies from the bottom up within the mold, the flow velocity of the mold material can be advantageously controlling in a precise manner as it flows over the leadframe 20, dies 50, 52, 54 and wires 110. To this end, the legs 72, 73 can be sized, shaped, and numbered to provide an interior space 74 having a desired shape and volume. The openings 80 and lateral openings 86 can be sized, shaped, and numbered to provide a desired flow rate along the path P1 into the out of the interior space 74. The first and second dies 50, 52 can be sized and positioned to size and shape the portion of the opening 60 in the first die pad 32 that is unobstructed (including fully obstructed), thereby controlling the flow rate along the paths P3 upwards and out of the interior space 74.

Similarly, the legs 92, 93 can be sized, shaped, and numbered to provide an interior space 94 having a desired shape and volume. The lateral openings 106 can be sized, shaped, and numbered to provide a desired flow rate along the paths P4 into the out of the interior space 94. The third die 54 can be sized and positioned to size and shape the portion of the opening 62 in the second die pad 33 that is unobstructed, thereby controlling the flow rate into and out of the interior space 94.

In one example, the downsets 70, 90 described herein are specifically designed to slow down the mold material 120 flow at the bottom of the mold beneath the leadframe 20 and help generate a more homogenous flow through/over the leadframe and components secured thereto. In particular, mold material 120 flow is slowed as it interacts with the downsets 70, 90 as the downsets create more tortuous flow paths for the mold material than if the downsets were omitted. This allows the mold material 120 flow to be precisely controlled in an advantageous matter.

In particular, the downsets 70, 90 are specifically configured to slow the mold material 120 flow velocity to a predetermined amount to help eliminate the formation of external voids in the final mold. The interior volumes 74, 94 and openings 80, 86, 106 are therefore configured to produce a desired mold flow therethrough and reduce the mold flow velocity at the bottom of the mold (beneath the leadframe 20) to a velocity closer or substantially equal to the mold flow at the top of the mold (above the leadframe). To this end, any number and configuration of downsets, including zero, can be provided for each die pad 32, 40. The downsets 70, 90 can be fluidly connected to openings 60, 62 in the corresponding die pad 32, 40, e.g., the downset secured to the first die pad, or act as an additional material reservoir provided beneath the die pad, e.g., the downset secured to the second die pad.

Figure 9:
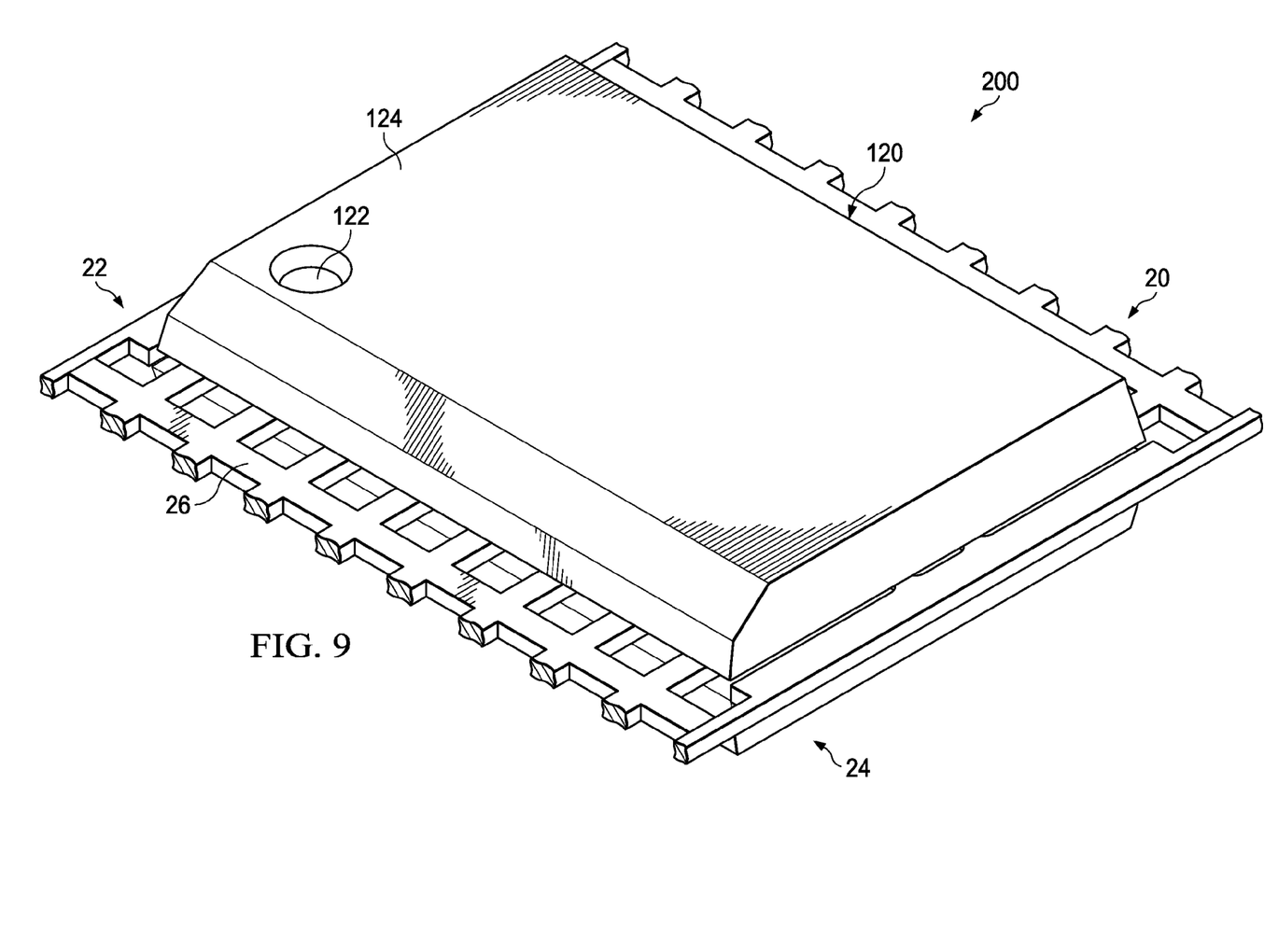
FIG. 9 illustrates a circuit board formed from the leadframe of FIG. 1.

Referring to FIG. 9, the mold material 120 is supplied in the mold until a package semiconductor device, such as an integrated circuit board 200, is formed that includes the leadframe 20 overmolded with the mold material 120. The circuit board 200 has an outer surface 124 with a depression 122 formed by the mold which gives a visual indication that the molding process is complete.

The mold can flow more quickly at the bottom of the mold compared to the top. As a result, a race horse effect can occur, resulting in visible, external voids in the final mold package. The voids can be significant enough to cause visual and mechanical quality control problems, leading to an undesirable product.

Furthermore, since the downsets described herein control the mold flow while maintaining the die pads in a coplanar relationship with the support members, the downsets resolve package external void issues without sacrificing wire bond yield, productivity or reliability. Moreover, the openings in the die pads reduce the contact surface area between each die and associated die pad. Consequently, the amount of adhesive needed to secure the dies to the die pads can be reduced by up to 50%, thereby advantageously reducing the cost of assembling the circuit board.

What have been described above are examples of the invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A leadframe for encasing in a mold material comprising:
    a planar substrate of electrically conductive material, the substrate having a top surface and a bottom surface;
    a plurality of interconnected support members formed in the substrate with spaces between the support members;
    a die pad formed in the substrate and connected to the support members, the die pad having a circumferential top surface portion for receiving an integrated circuit die; and
    a downset formed in the substrate below the die pad, within the circumferential top surface portion, and extending below the bottom surface of the substrate, the downset including opposed sidewalls of the substrate extending down below the bottom surface and a bottom wall extending between the opposed walls, the bottom wall having a top surface below the bottom surface of the substrate, the downset forming a space below the die pad with an opening lateral of the bottom wall.

2. The leadframe recited in claim 1, in which at least one of the sidewalls includes an opening for controlling the flow of mold material through the downset.

3. The leadframe recited in claim 1, in which the sidewalls and bottom wall define a downset having a triangular shape.

4. The leadframe recited in claim 1, in which the downset includes a pair of lateral openings positioned between the sidewalls at lateral sides of the bottom wall.

5. The leadframe recited in claim 1, in which the die pad is coplanar with the support members.

6. A circuit board for encasing in a mold material comprising:
   a leadframe including:
      a planar substrate of electrically conductive material, the substrate having a top surface and a bottom surface;
      a plurality of interconnected support members formed in the substrate with spaces between the support members;
      a die pad formed in the substrate and connected to the support members, the die pad having a circumferential top surface portion for receiving an integrated circuit; and
      a downset formed in the substrate below the die pad, within the circumferential top surface portion, and extending below the bottom surface of the substrate, the downset including opposed sidewalls of the substrate extending down below the bottom surface and a bottom wall extending between the opposed walls, the bottom wall having a top surface below the bottom surface of the substrate, the downset forming a space below the die pad with an opening lateral of the bottom wall;
   a die secured to the die pad; and
   at least one wire electrically connecting the die to the support members, wherein the interior volume of the downset receives a flow of the mold material to reduce the velocity of the mold material flow around the circuit board.

7. The circuit board recited in claim 6, in which at least one of the sidewalls includes an opening for controlling the flow of mold material through the downset.

8. The circuit board recited in claim 6, in which the sidewalls and bottom wall define a downset having a triangular shape.

9. The circuit board recited in claim 6, in which the downset includes a pair of lateral openings positioned between the sidewalls at lateral sides of the bottom wall.

10. A method of forming a circuit board comprising:
    forming a leadframe having a planar substrate of electrically conductive material, the substrate having a top surface and a bottom surface; a plurality of interconnected support members formed in the substrate with spaces between the support members; a die pad formed in the substrate and connected to the support members, the die pad having a circumferential top surface portion for receiving an integrated circuit; and a downset formed in the substrate below the die pad, within the circumferential top surface portion, and extending below the bottom surface of the substrate, the downset including opposed sidewalls of the substrate extending down below the bottom surface and a bottom wall extending between the opposed walls, the bottom wall having a top surface below the bottom surface of the substrate, the downset forming a space below the die pad with an opening lateral of the bottom wall;
    securing a die to the die pad;
    electrically connecting the die to the support members with at least one wire; and
    overmolding the circuit board with an electrically insulating material mold material that flows over the leadframe, die, and wire, wherein the interior volume of the downset receives a flow of the mold material to reduce the velocity of the mold material flow through the downset.

11. A package semiconductor device comprising:
    a leadframe including:
       a planar substrate of electrically conductive material, the substrate having a top surface and a bottom surface;
       a plurality of interconnected support members formed in the substrate with spaces between the support members;
       a die pad formed in the substrate and connected to the support members, the die pad having a circumferential top surface portion for receiving an integrated circuit; and
       a downset formed in the substrate below the die pad, within the circumferential top surface portion, and extending below the bottom surface of the substrate, the downset including opposed sidewalls of the substrate extending down below the bottom surface and a bottom wall extending between the opposed walls, the bottom wall having a top surface below the bottom surface of the substrate, the downset forming a space below the die pad with an opening lateral of the bottom wall;
    a die secured to the die pad;
    at least one wire electrically connecting the die to the support members; and
    mold material overmolded around the leadframe, the die, and the at least one wire to electrically insulate the same, wherein the interior volume of the downset receives a flow of the mold material to reduce the velocity of the mold material flow through the downset during overmolding.

* * * * *